(12) United States Patent
Ho

(10) Patent No.: US 10,763,080 B2
(45) Date of Patent: Sep. 1, 2020

(54) SIMPLE AND ENVIRONMENT-FRIENDLY PRODUCTION EQUIPMENT FOR CARBON NANOMATERIALS

(71) Applicant: WORLD LINKAGE HOLDINGS LIMITED, Hongkong (CN)

(72) Inventor: Tsz Kin Ho, Hongkong (CN)

(73) Assignee: WORLD LINKAGE HOLDINGS LIMITED, Hong Kong (CN)

( * ) Notice: Subject to any disclaimer, the term of this patent is extended or adjusted under 35 U.S.C. 154(b) by 181 days.

(21) Appl. No.: 16/112,494

(22) Filed: Aug. 24, 2018

(65) Prior Publication Data

US 2018/0366299 A1 Dec. 20, 2018

(51) Int. Cl.

| | | |
|---|---|---|
| *H01J 37/32* | (2006.01) | |
| *H01J 37/18* | (2006.01) | |
| *H01J 37/24* | (2006.01) | |
| *B82Y 30/00* | (2011.01) | |
| *B82Y 40/00* | (2011.01) | |
| *C01B 32/15* | (2017.01) | |

(52) U.S. Cl.
CPC ...... *H01J 37/32064* (2013.01); *H01J 37/185* (2013.01); *H01J 37/241* (2013.01); *H01J 37/32944* (2013.01); *B82Y 30/00* (2013.01); *B82Y 40/00* (2013.01); *C01B 32/15* (2017.08)

(58) Field of Classification Search
CPC .. H01J 37/32064; H01J 37/185; H01J 37/241; H01J 37/32944; C01B 32/15; C01B 33/02; B82Y 30/00; B82Y 40/00; G21B 1/05; Y02E 30/122; H02K 21/24; H02K 1/2793; H02K 1/143; H02K 1/141; H02K 3/18; H02P 27/06; C09C 3/063; C09C 1/64; C09C 1/622; C09C 1/627; C01P 2004/64; C01P 2004/04; C01P 2002/70; H05H 2001/4622; H05H 1/46; B22F 2999/00; B22F 1/02; B22F 9/026; B22F 2201/30; B22F 2202/13; B22F 2202/11; H01L 51/0045

See application file for complete search history.

(56) References Cited

U.S. PATENT DOCUMENTS

2012/0033775 A1* 2/2012 Santilli ................ G21B 1/05
376/107
2017/0133897 A1* 5/2017 Ritchie ................ H02K 21/24

\* cited by examiner

*Primary Examiner* — Xiuyu Tai

(57) ABSTRACT

A simple and environment-friendly production equipment for carbon nano-materials includes a power source and an AC/DC rectifier. A vacuum device for producing the carbon nano-materials is connected with two output ends of the AC/DC rectifier. An alternate current is generated by the power source and then is rectified into a direct-current power supply through the AC/DC rectifier to provide a power supply for a first graphite rod and a second graphite rod in the same direction, so as to generate a high-voltage electric arc at a junction of the first graphite rod and the second graphite rod, and plasma ionization is conducted on substances on the two graphite rods through the high-voltage electric arc, so that carbon atoms in the two graphite rods are decomposed, and carbon nano-materials are separated out and collected into a collector through a cover.

2 Claims, 3 Drawing Sheets

SIMPLE AND ENVIRONMENT-FRIENDLY PRODUCTION EQUIPMENT FOR CARBON NANOMATERIALS

BACKGROUND OF THE PRESENT INVENTION

Field of Invention

The present invention relates to a simple and environment-friendly production equipment for carbon nano-materials for nano-products, such as graphene and fullerene.

Description of Related Arts

Carbon nano-material is a fibrous nano-carbon material which is made of a multi-layer graphite sheet. It is a one-dimensional carbon material between carbon nano-tubes and ordinary carbon fiber. It has a high crystal orientation, good conductivity and heat conduction performance. The carbon nano-material has the characteristics of low density, high specific modulus, high specific strength, high electrical conductivity and thermal stability of ordinary carbon fiber grown by chemical vapor deposition, so it is widely used in aerospace, transportation, sports and leisure products, as well as medical, mechanical and textile industries. The existing carbon nano-material preparation equipment mainly comprises chemical vapor deposition equipment, electro-spinning equipment and solid phase synthesis equipment. However, the structure of the carbon nano-material preparation device is relatively complicated and the cost is relatively high, so the surrounding environment is easily contaminated during processing. The existing production methods of nano materials in the streets are divided into electric arc method, chemical stripping method and mechanical stripping method. The electric arc method ionizes a carbon material through an electric arc. The method produces the isotope of nano-carbons, costing too much in electricity and energy, so it is not suitable for industrialization. The chemical stripping method oxidizes carbon into an oxide, and uses other chemicals to extract oxygen molecules, leaving the isotope of carbon. The method is easy to cause a heavy pollution to the environment and water, leaving too many impurities in the isotope with poor quality. Despite the most opportunity of volume production, it fails to meet the standard. The primitive carbon is stripped layer-by-layer by a mechanical method to obtain the isotope of carbon, known as a mechanical stripping method. This method is complicated and has a high cost but low efficiency, so it is not suitable for volume production.

SUMMARY OF THE PRESENT INVENTION

In view of the defects of the prior art, the technical objective of the present invention is to provide a simple and environment-friendly preparation equipment, which is low in cost and energy consumption, and is environment-friendly and suitable for volume production of carbon nano-materials.

In order to achieve the above technical objective, the present invention provides a simple and environment-friendly production equipment for carbon nano-materials, comprising a power source and an AC/DC (alternating current/direct current) rectifier connected to the power source, wherein: a vacuum device for producing carbon nano-materials is connected with two output ends of the AC/DC rectifier, and a controller for controlling the vacuum device is arranged on the vacuum device.

According to the technical features mainly mentioned above, the vacuum device comprises a vacuum box, a first holder, a first graphite rod, a second holder, a second graphite rod, a collector and a cover, wherein: the first graphite rod is mounted on an upper end of the first holder, the second graphite rod is mounted on an upper end of the second holder, the first holder and the second holder are arranged in parallel, the first graphite rod and the second graphite rod are arranged in parallel and respectively connected to the AC/DC rectifier; the collector is mounted between the first holder and the second holder, and located at a lower end of a junction of the first graphite rod and the second graphite rod; a lower end of the cover is mounted on an upper end of the collector, and an upper end or a middle portion of the cover is located at a junction of a second end of the first graphite rod and a second end of the second graphite rod, so that the cover connects the junction of the second end of the first graphite rod and the second end of the second graphite rod with the upper end of the collector to form a closed space; all of the first graphite rod, the second graphite rod, the first holder, the second holder, the cover and the collector are arranged inside the vacuum box.

Beneficial effects of the present invention are as follows: the vacuum device for producing the carbon nano-materials is connected with the two output ends of the AC/DC rectifier, and the controller for controlling the vacuum device is arranged on the vacuum device. An alternate current is generated by the power source and then is rectified into a direct-current power supply through the AC/DC rectifier to provide a power supply for the first graphite rod and the second graphite rod in the same direction, so as to generate a high-voltage electric arc at the junction of the first graphite rod and the second graphite rod, and plasma ionization is conducted on substances on the graphite rods through the high-voltage electric arc, so that carbon atoms in the graphite rods are decomposed, and carbon nano-materials are separated out and collected into the collector through the cover. Compared with the prior art, the simple and environment-friendly production equipment for carbon nano-materials provided by the present invention has advantages of simple structure and low cost. Moreover, the whole carbon nano-material production process is completed in the closed space of the cover, and no gas is exhausted to an exterior of the cover, thus the environmental friendliness effect is achieved. In addition, the manufacturing method of the present invention is suitable for volume production.

DETAILED DESCRIPTION OF THE PREFERRED EMBODIMENT

In order to more clearly understand technical problems to be solved, technical solutions and advantages of the present invention, the present invention is further described in detail with reference to accompanying drawings and embodiments as follows. It should be understood that specific embodiments described herein are only to illustrate rather than to limit the present invention.

Figure 1:
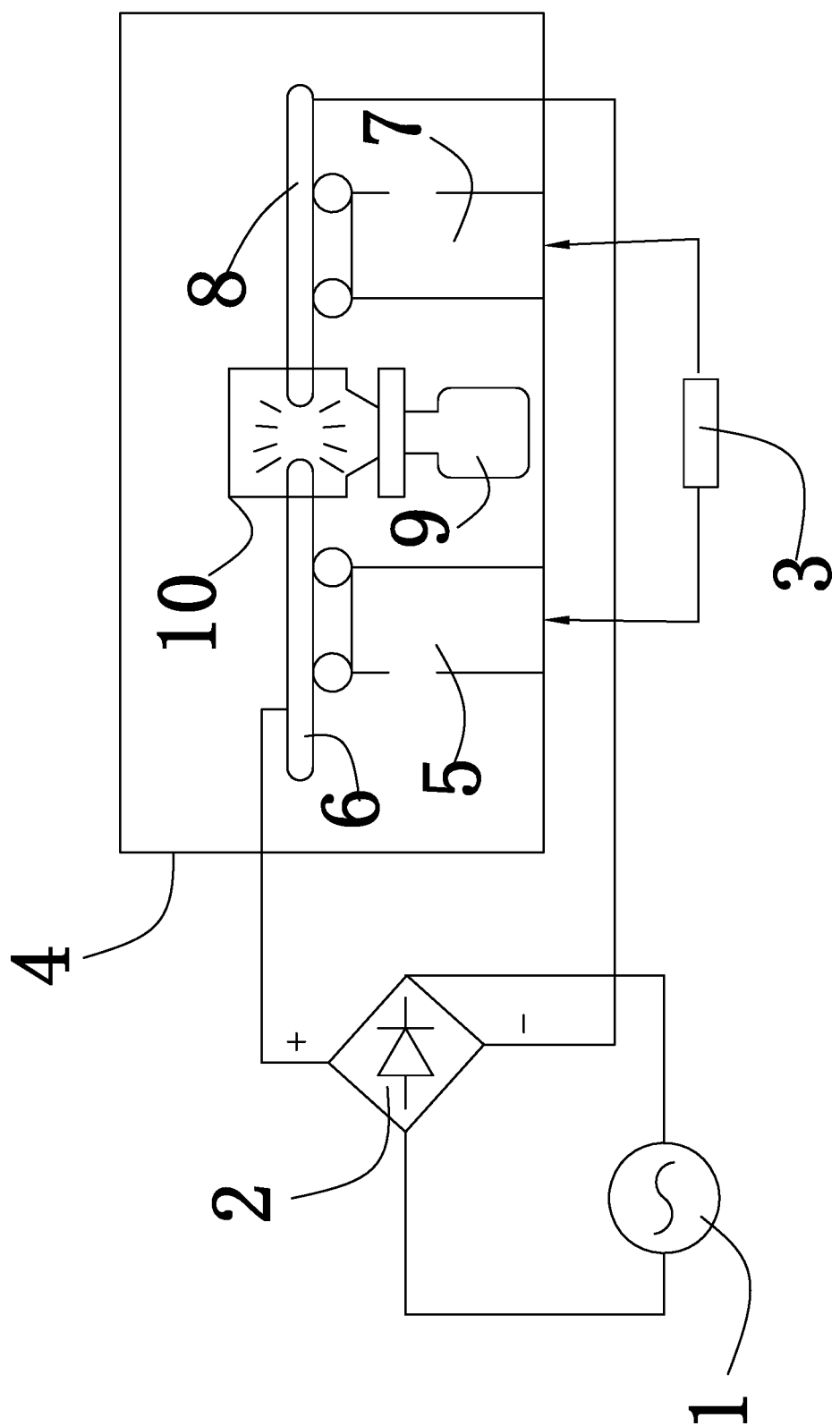
FIG. 1 is a schematic view of a simple and environment-friendly production equipment for carbon nano-materials provided by the present invention.
Figure 2:
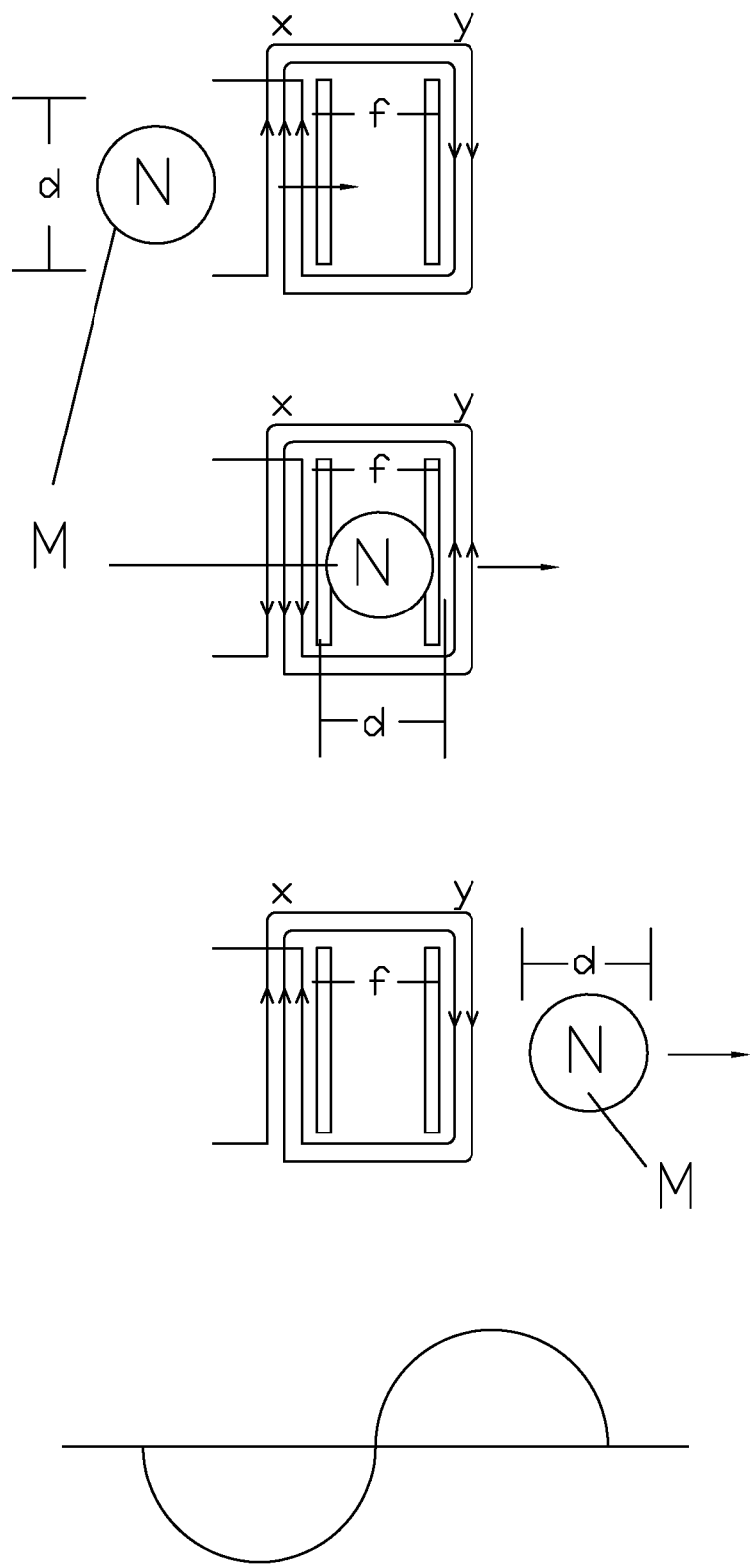
FIG. 2 is a schematic diagram of a double iron-core inductive coil provided by the present invention.
Figure 3:
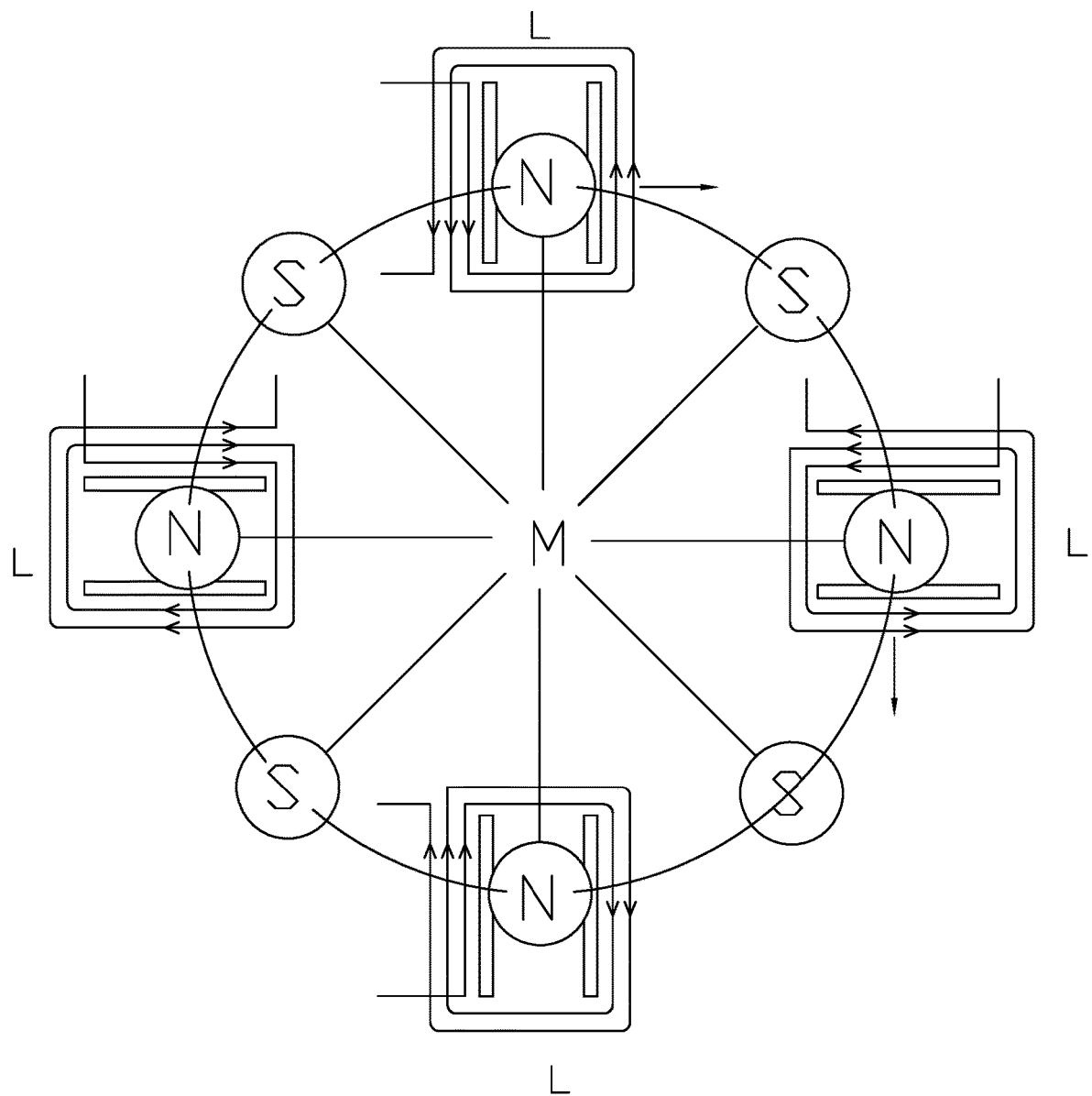
FIG. 3 is a schematic diagram of a generator using a double iron-core inductive coil set provided by the present invention.

As shown in FIG. 1 to FIG. 3, a simple and environment-friendly production equipment for carbon nano-materials provided by the present invention is further described in combination with the following embodiments. The equipment comprises a power source 1, an AC/DC (alternating current/direct current) rectifier 2, a vacuum device and a controller 3.

The vacuum device comprises a vacuum box 4, a first holder 5, a first graphite rod 6, a second holder 7, a second graphite rod 8, a collector 9, and a cover 10 made from graphite, wherein: the first graphite rod 6 is mounted on an upper end of the first holder 5, the second graphite rod 8 is mounted on an upper end of the second holder 7, the first holder 5 and the second holder 7 are arranged in parallel, the first graphite rod 6 and the second graphite rod 8 are arranged in parallel and are respectively connected to the AC/DC rectifier 2; the collector 9 is mounted between the first holder 5 and the second holder 7, and located at a lower end of a junction of the first graphite rod 6 and the second graphite rod 8; a lower end of the cover 10 is mounted on an upper end of the collector 9, and an upper end or a middle portion of the cover 10 is located at a junction of a second end of the first graphite rod 6 and a second end of the second graphite rod 8, so that the cover 10 connects the junction of the second end of the first graphite rod 6 and the second end of the second graphite rod 8 with the upper end of the collector 9 to form a closed space; all of the first graphite rod 6, the second graphite rod 8, the first holder 5, the second holder 7, the cover 10 and the collector 9 are arranged inside the vacuum box 4. Being of a magnetic current open type, the power source 1 has an inductive circuit flowing in a clockwise direction and comprises a double iron-core inductive coil set.

Two input ends of the AC/DC rectifier 2 are respectively mounted at both ends of the power source 1, the vacuum device is connected to two output ends of the AC/DC rectifier 2, and the controller 3 is mounted on the vacuum device. A first end of the first graphite rod 6 is connected to a positive end of the AC/DC rectifier 2, and a first end of the second graphite rod 8 is connected to a negative end of the AC/DC rectifier 2. The first holder 5 is mounted at the lower end of the first graphite rod 6, and the second holder 7 is mounted at the lower end of the second graphite rod 8; the cover 10 is connected with the upper end of the collector 9, and the collector 9 is mounted between the first holder 5 and the second holder 7. Two ends of the controller 3 are respectively connected with the first holder 5 and the second holder 7.

An output end of the power source 1 outputs a high-voltage alternate current (AC) of about 1500 v to 2000 v, and the high-voltage AC is converted into a direct current (DC) through the AC/DC rectifier 2, the DC is respectively connected to the first end of the graphite rod 6 and the first end of the second graphite rod 8 inside the vacuum box 4. The first graphite rod 6 and the second graphite rod 8 are respectively pushed by the first holder 5 and the second holder 7, and the first holder 5 and the second holder 7 are subjected to the control of the controller 3. When a distance between a second end of the first graphite rod 6 and a second end of the second graphite rod 8 is in a range of 2 mm and 10 mm, a high-voltage electric arc is generated between the first graphite rod 6 and the second graphite rod 8, and plasma ionization is conducted on substances on the first graphite rod 6 and the second graphite rod 8 through the high-voltage electric arc, so that carbon atoms on the surface of the graphite rods are decomposed and then recombined into new carbon nano-materials. The cover 10 covers the high-voltage electric arc like a lampshade, and all the new carbon nano-materials generated under the action of the high-voltage electric arc are collected and stored inside the collector 9.

The vacuum box 4 maintains a vacuum of more than 2 Torr to ensure that a purity of a product to be produced meets requirements. A size of the electric arc generated between the first graphite rod 6 and the second graphite rod 8 can be adjusted, and the distance between the first graphite rod 6 and the second graphite rod 8 can control the size of the electric arc; in addition, after the electric arc is generated between the first graphite rod 6 and the second graphite rod 8, a voltage between the first graphite rod 6 and the second graphite rod 8 drops to only 50 v to 250 v, a current therebetween is 2.5 A and a power consumption therebetween is 125 wh to 625 wh, thus reducing the cost of production.

In the present embodiment, the power source 1 is a double iron-core inductive coil electric arc generator. The AC/DC rectifier 2 is configured to control the vacuum device for producing carbon isotope nano-materials. A stator of the generator is a double iron-core inductive coil set, wherein a distance between two iron cores larger than a width of the magnet, a magnetic circuit is an open-circuit, an induced current flows in a clockwise direction; and a mover of the generator is a magnet set. An air pressure of the vacuum box 4 is drawn to −2 Torr to 6 Torr. The first holder 5, the first graphite rod 6, the second holder 7, the second graphite rod 8, the collector 9, and the cover 10 are mounted inside the vacuum box 4, and the high-voltage electric arc is generated at the junction of the first graphite rod 6 and the second graphite rod 8. The first holder used for controlling the first graphite rod 6 and the second holder used for controlling the second graphite rod 8 ensure the stable high-voltage electric arc at the junction of the two graphite rods, and can issue a siren to protect the equipment safety when the high-voltage electric arc is abnormal.

The stator of the generator is the double iron-core inductive coil set, wherein the distance between the two iron cores is larger than a width of the magnet, the magnetic circuit is the open-circuit, the induced current flows in the clockwise direction; and the mover of the generator is the magnet set. This is the central design in this embodiment: the output ends of the generator designed in this way can be directly short-circuited and the generator is not burned, so it is easy to generate the high-voltage electric arc and the energy consumption is very low. Therefore, a power supply produced by the generator makes the manufacture of carbon nano-materials simple and environment-friendly, the production equipment is extremely simple and low-cost, and the cost of energy for production is very low. In this embodiment, the production of the materials requires the generation of an arc of only 125 W and the production of one gram of carbon nano-materials requires only 1 kW/h of electric energy.

The AC/DC rectifier 2 is connected to the double iron-core inductive coil electric arc generator, the vacuum device for producing the carbon nano-materials is connected with the output ends of the AC/DC rectifier 2, and the controller 3 for controlling the vacuum device is arranged on the vacuum device. The collector 9 is mounted between the first holder 5 and the second holder 7, and located at the lower end of the junction of the first graphite rod 6 and the second graphite rod 8; the lower end of the cover 10 is mounted on the upper end of the collector 9, and the upper end or the middle portion of the cover 10 is located at the junction of the second end of the first graphite rod 6 and the second end of the second graphite rod 8, so that the cover 10 connects the junction of the second end of the first graphite rod 6 and the second end of the second graphite rod 8 with the upper end of the collector 9 to form the closed space. All of the first graphite rod 6, the second graphite rod 8, the first holder 5, the second holder 7, the cover 10 and the collector 9 are located inside the vacuum box. The characteristics of the double iron-core inductive coil electric arc generator make the manufacturing of carbon nano-materials economical and environment-friendly. In addition, the manufacturing method provided by the embodiment is suitable for volume production.

The double iron-core inductive coil shown in FIG. 2 comprises two iron cores X and Y. When a magnet M moves closer to the inductive coil from a left side of FIG. 2, the iron core X is closer to the magnet M, and the iron core X will greatly guide magnetic lines of the magnet M to cut a left copper line of the inductive coil. However, at the same time, the iron core Y of the inductive coil is far away, and there are few or no magnetic lines guided by the iron core Y to cut a right copper line of the inductive coil, so the induced current can only flow in a same direction. When the magnet M moves between the iron core X and the iron core Y of the inductive coil, an amount of both sides of the inductive coil to be cut by the magnetic lines of the magnet M guided by the iron core X and the iron core Y remains the same, but an amount of the magnetic lines of the iron core X reduces while an amount of the magnetic lines of the iron core Y increases, so the induced current can only flow in the same direction. As the magnet M moves away from the inductive coil, the magnet M will be closer to the iron core Y, which causes an amount of a right side of the inductive coil to be cut by the magnetic lines of the magnet M guided by the iron core Y to increase; on the contrary, the iron core X of the inductive coil is far away, there are few or even no magnetic lines guided by the iron core X to cut the left copper line of the inductive coil, so the induced current can only flow in the clockwise direction in the inductive coil.

The double iron-core inductive coil set comprises four independent double iron-core inductive coils. Each double iron-core inductive coil induces currents in a clockwise flow, so each double iron-core inductive coil can be regarded as an independent power supply, and four independent double iron-core inductive coils can be connected in series or in parallel to meet different design requirements. FIG. 3 shows an optimal sequence between the stator double iron-core inductive coil and the mover magnet of the generator with the double iron-core inductive coil set.

To sum up, the vacuum device for producing carbon nano-materials is connected with the output ends of the AC/DC rectifier 2, and the carbon controller 3 for controlling the vacuum device is arranged on the vacuum device. An alternate current is generated by the power source 1 and then is rectified into a direct-current power supply through the AC/DC rectifier 2 to provide a power supply for the first graphite rod 6 and the second graphite rod 8 in the same direction, so as to generate the high-voltage electric arc at the junction of the first graphite rod 6 and the second graphite rod 8, and the plasma ionization is conducted on substances on the graphite rods through the high-voltage electric arc, so that carbon atoms in the graphite rods are decomposed, and carbon nano-materials are separated out and collected into the collector 9 through the cover. Compared with the prior art, the simple and environment-friendly production equipment for carbon nano-materials provided by the present invention has the advantages of simple structure and low cost. The whole carbon nano-material production process is completed in the closed space of the cover 10, and no gas is exhausted to the outside, thus the environmental friendliness effect is achieved. In addition, the manufacturing method of the present invention is suitable for volume production.

The foregoing is only preferred embodiments of the present invention as shown in the drawings and not intended to limit the protective scope of the present invention. Any modifications, equivalent substitutions and improvements made by those skilled in the art without departing from the scope and spirit of the present invention are intended to be included within the scope of the present invention.

What is claimed is:

1. A production equipment for carbon nano-materials, comprising a power source, an AC/DC (alternating current/direct current) rectifier, a vacuum device for producing the carbon nano-materials under vacuum condition, and a controller for controlling the vacuum device, wherein:

two ends of the power source are respectively connected with two input ends of the AC/DC rectifier, the vacuum device is connected with a positive output end and a negative output end of the AC/DC rectifier, the controller is arranged on the vacuum device;

the vacuum device comprises a vacuum box, a first holder, a first graphite rod, a second holder, a second graphite rod, a collector, and a cover made from graphite, wherein:

the first graphite rod is mounted on an upper end of the first holder;

the second graphite rod is mounted on an upper end of the second holder;

the first holder and the second holder are arranged in parallel;

the first graphite rod and the second graphite rod are arranged in parallel and respectively connected with the AC/DC rectifier;

the collector is mounted between the first holder and the second holder, and located below a junction of a second end of the first graphite rod and a second end of the second graphite rod;

two ends of the controller are connected with the first holder and the second holder, respectively;

a first end of the first graphite rod is connected with the positive output end, a first end of the second graphite rod is connected with the negative output end of the AC/DC rectifier;

a lower end of the cover is mounted on an upper end of the collector, and an upper end or a middle portion of the cover is located at the junction of the second end of the first graphite rod and the second end of the second graphite rod;

the cover and the upper end of the collector form a closed space, the junction of the second end of the first graphite rod and the second end of the second graphite rod is provided within the closed space;

all of the first graphite rod, the second graphite rod, the first holder, the second holder, the cover and the collector are arranged inside the vacuum box, in such a manner that an alternate current is generated by the power source and then is rectified into a direct current through the AC/DC rectifier to provide a power supply for the first graphite rod and the second graphite rod in a same direction, a high-voltage electric arc at the junction of the second end of the first graphite rod and the second end of the second graphite rod, plasma ionization is conducted on substances on the first graphite rod and the second graphite rod through the high-voltage electric arc, so that carbon atoms in the first graphite rod and the second graphite rod are decomposed, and the carbon nano-materials are separated out and collected into the collector through the cover.

2. The production equipment, as claimed in claim 1, wherein the power source is a double iron-core inductive coil electric arc generator, a stator of the generator is a double iron-core inductive coil set, a distance between two iron cores is larger than a width of a magnet, a magnetic circuit is an open-circuit, an induced current flows in a clockwise direction, and a mover of the generator is a magnet set.

* * * * *